United States Patent
Zhang

(10) Patent No.: US 9,886,205 B2
(45) Date of Patent: Feb. 6, 2018

(54) PROGRAMMABLE GAMMA VOLTAGE OUTPUT DEVICES AND DISPLAY DEVICES

(71) Applicant: Shenzhen China Star Optoelectronics Technology Co., Ltd., Shenzhen, Guangdong (CN)

(72) Inventor: Xianming Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 137 days.

(21) Appl. No.: 14/906,250

(22) PCT Filed: Jul. 31, 2015

(86) PCT No.: PCT/CN2015/085700
§ 371 (c)(1),
(2) Date: Jan. 19, 2016

(87) PCT Pub. No.: WO2017/012138
PCT Pub. Date: Jan. 26, 2017

(65) Prior Publication Data
US 2017/0168734 A1     Jun. 15, 2017

(30) Foreign Application Priority Data
Jul. 20, 2015 (CN) .......................... 2015 1 0426893

(51) Int. Cl.
*G06F 3/06* (2006.01)
*G11C 7/16* (2006.01)
(Continued)

(52) U.S. Cl.
CPC ............ *G06F 3/0619* (2013.01); *G06F 3/065* (2013.01); *G06F 3/0679* (2013.01); *G09G 5/02* (2013.01);
(Continued)

(58) Field of Classification Search
CPC ...... G06F 3/0619; G06F 3/065; G06F 3/0679; G09G 2320/0276; G09G 2330/00; G09G 5/02; G11C 7/10; G11C 7/16; G11C 7/22
See application file for complete search history.

(56) References Cited

U.S. PATENT DOCUMENTS 5,003,541 A    3/1991  Mester
6,271,822 B1 * 8/2001  Chiang ................. G06F 3/1475
                                                     345/99

(Continued)

FOREIGN PATENT DOCUMENTS

CN          1329337 A       1/2002
CN        101030360 A       9/2007
(Continued)

*Primary Examiner* — Ram Mistry
(74) *Attorney, Agent, or Firm* — Andrew C. Cheng

(57) ABSTRACT

The present disclosure discloses a programmable Gamma voltage output device having a non-volatile memory (NVM), a controller, a digital signal generation module, a digital to analog converter (DAC), and output verification module. The NVM is configured for duplicating a copy of a corresponding voltage data code when programming the voltage data code. The controller is configured for sending control signals to the digital signal generation module in accordance with the voltage data code. The digital signal generation module is configured for outputting digital signals to the DAC in accordance with the control signals. The DAC is configured for converting the digital signals to a Gamma voltage. The output verification module is configured for verifying whether the Gamma voltage is within a predetermined voltage range. In addition, a display device is also disclosed.

9 Claims, 3 Drawing Sheets

(51) Int. Cl.
*G11C 7/10* (2006.01)
*G11C 7/22* (2006.01)
*G09G 5/02* (2006.01)

(52) U.S. Cl.
CPC .................. *G11C 7/10* (2013.01); *G11C 7/16* (2013.01); *G11C 7/22* (2013.01); *G09G 2320/0276* (2013.01); *G09G 2330/00* (2013.01)

(56) References Cited

U.S. PATENT DOCUMENTS

| | | | |
|---|---|---|---|
| 6,281,944 B1 | 8/2001 | Kim | |
| 6,359,389 B1 * | 3/2002 | Medina | G09G 3/2011 315/169.1 |
| 6,515,922 B1 | 2/2003 | Yamagata | |
| 2006/0202929 A1 * | 9/2006 | Baum | G09G 3/3648 345/89 |
| 2008/0136763 A1 | 6/2008 | Ohashi et al. | |
| 2009/0040389 A1 * | 2/2009 | Wang | H04N 5/202 348/674 |
| 2015/0255042 A1 * | 9/2015 | Oh | G09G 5/18 345/212 |

FOREIGN PATENT DOCUMENTS

| | | |
|---|---|---|
| CN | 101667404 A | 3/2010 |
| CN | 103000157 A | 3/2013 |
| CN | 103794187 A | 5/2014 |
| CN | 204045190 U | 12/2014 |
| JP | 2001306046 A | 11/2001 |

\* cited by examiner

PROGRAMMABLE GAMMA VOLTAGE OUTPUT DEVICES AND DISPLAY DEVICES

CROSS REFERENCE

This application claims the priority of Chinese Patent Application No. 201510426893.0, entitled "Programmable Gamma voltage output devices and display devices", filed on Jul. 20, 2015, the disclosure of which is incorporated herein by reference in its entirety.

FIELD OF THE INVENTION

The present invention relates to display technology field, and more particularly to a programmable Gamma voltage output device and a display device.

BACKGROUND OF THE INVENTION

With the development of electrical technology, the products of high definition, such as, tablet PCs and TVs, have been favored by consumers. At the same time, user demands toward the display performances have been increased. The programmable Gamma correction buffer circuit chip (P-Gamma IC) is a commonly used chip in high-resolution display devices. The Gamma voltage is outputted in accordance with the Gamma Code, and the Gamma voltage is adopted to realize the display. Thus, the performance of the P-Gamma IC directly affects the display performance.

During the operation of P-Gamma IC, it may happen that the Gamma voltage is not compatible with that corresponding to the code. As such, the displayed images may be bad or abnormal, which affects the display performance.

SUMMARY OF THE INVENTION

The technical issue that the embodiment of the present disclosure solves is to provide a programmable Gamma voltage output device and a display device to avoid abnormal Gamma voltage so as to enhance the display performance.

In one aspect, a programmable Gamma voltage output device includes: a non-volatile memory (NVM), a controller, a digital signal generation module, a digital to analog converter (DAC), and output verification module, the NVM connects with the controller, the controller connects with the digital signal generation module, the digital signal generation module connects with the DAC, the DAC connects with the output verification module, and the output verification module connects with the controller, wherein: the NVM is configured for duplicating a copy of a corresponding voltage data code when programming the voltage data code; the controller is configured for sending control signals to the digital signal generation module in accordance with the voltage data code, or is configured for sending the control signals to the digital signal generation module in accordance with the copy of the code when the output verification module sends an error feedback; the digital signal generation module is configured for outputting digital signals to the DAC in accordance with the control signals; the DAC is configured for converting the digital signals to a Gamma voltage; and the output verification module is configured for verifying whether the Gamma voltage is within a predetermined voltage range, and for sending the error feedback when the Gamma voltage is not within a predetermined voltage range.

Wherein the NVM includes a predetermined backup area for storing the copy of the code.

Wherein the output verification module includes a plurality of comparators and an AND component, non-inverting input ends of each of the comparators respectively connect to output ends of different DACs, inverting input ends of each of the comparators respectively connect to a predetermined reference voltage, output ends of each of the comparators respectively connect to different input ends of the AND component, and an output end of the AND component connect to the controller; when a difference between the Gamma voltage received from the non-inverting input end of the comparator and the reference voltage received from the inverting input end is not within the predetermined voltage range, a low level is outputted to the AND component, when any one of the input ends of the AND component receives the low level, the low level is outputted to the controller; and the controller sends the control signals in accordance with the copy of the code upon receiving the low level outputted by the AND component.

Wherein: when the difference between the Gamma voltage received from the non-inverting input end of the comparator and the reference voltage received from the inverting input end is within the predetermined voltage range, a high level is outputted to the AND component, when all of the input ends of the AND component receives the high level, the high level is outputted to the controller; and the controller sends the control signals in accordance with the copy of the code upon receiving the high level outputted by the AND component.

Wherein the number of the comparators is less than or equals to the number of the DACs.

Wherein the controller sends the control signals in accordance with the copy of the code, if the error feedback is sent by the output verification module again, the controller stops sending the control signals, and a power supply system of the programmable Gamma voltage output device is turned off.

Wherein the power supply system further includes a power supply and a PWM chip.

Wherein the programmable Gamma voltage output device further includes a booster buffer, and an input end of the booster buffer connects with output ends of the DAC.

Wherein the programmable Gamma voltage output device further includes an operational amplifier, an input end of the operational amplifier connects with an output end of the booster buffer.

In another aspect, a display device includes: a display panel, a power supply system, and the above programmable Gamma voltage output device, the power supply system connects with the programmable Gamma voltage output device, and the programmable Gamma voltage output device connects with the display panel.

In view of the above, the programmable Gamma voltage output device includes the NVM, the controller, the digital signal generation module, the DAC, and the output verification module. The NVM is configured for duplicating a copy of the code when programming the voltage data code. The controller is configured for sending control signals to the digital signal generation module. The digital signal generation module is configured for outputting the digital signals in accordance with the control signals. The DAC is configured for converting the digital signals into the Gamma voltage and for outputting the Gamma voltage. The output verification module is configured for sending the error feedback to the controller when the Gamma voltage is not within a predetermined voltage range. Further, the controller sends the control signals in accordance with the copy of the code so as to solve the abnormal Gamma voltage issue and to enhance the display performance.

BRIEF DESCRIPTION OF THE DRAWINGS

In order to more clearly illustrate the embodiments of the present disclosure or prior art, the following figures will be described in the embodiments are briefly introduced. It is obvious that the drawings are merely some embodiments of the present disclosure, those of ordinary skill in this field can obtain other figures according to these figures without paying the premise.

DETAILED DESCRIPTION OF PREFERRED EMBODIMENTS

Embodiments of the present disclosure are described in detail with the technical matters, structural features, achieved objects, and effects with reference to the accompanying drawings as follows. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

The programmable Gamma voltage output device may be incorporated in display devices, such as TVs, tablets, smartphones, personal computers, audio/video players, E-readers, game consoles, and automotive electronics.

Figure 1:
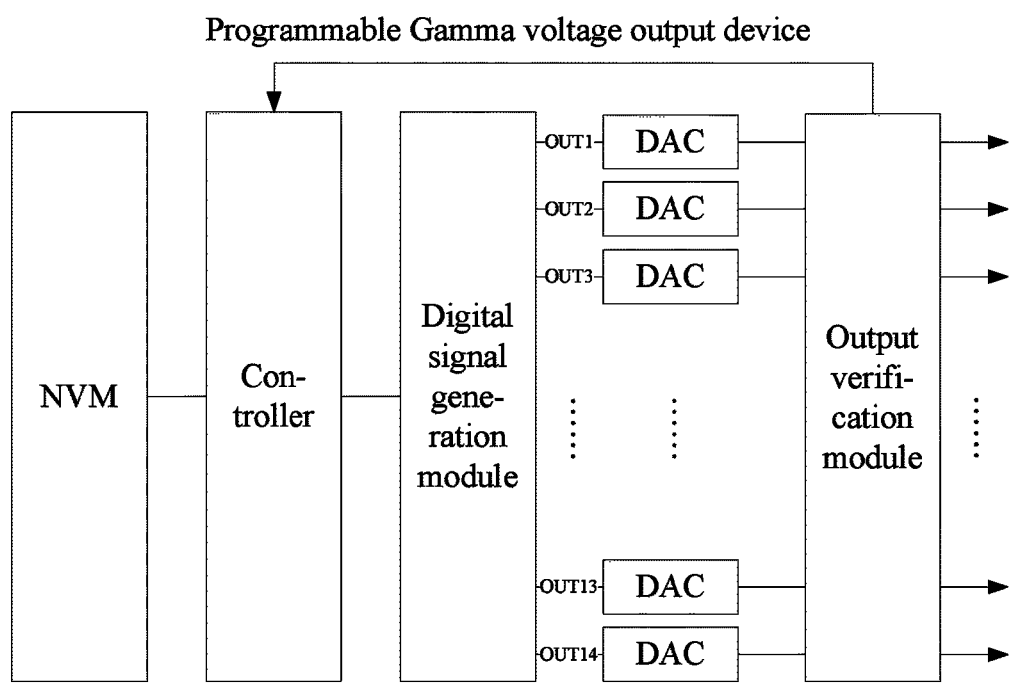
FIG. 1 is a schematic view of the programmable Gamma voltage output device in accordance with one embodiment.

FIG. 1 is a schematic view of the programmable Gamma voltage output device in accordance with one embodiment. The programmable Gamma voltage output device includes a non-volatile memory (NVM), a controller, a digital signal generation module, a digital to analog converter (DAC), and output verification module.

The NVM is configured for duplicating a copy of the code when programming the voltage data code. It can be understood that the NVM is a storage, wherein the data is stored within the memory after booting down. In the embodiment, the NVM includes a predetermined backup area. For instance, a storage having a size equaling to 512M is preserved for the backup area. The predetermined backup area is only opened during the programming process, and is configured for storing the backup of the code. Specifically, when the NVM is programming the voltage data code, the code is also backed up to the backup area. It is to be noted that the voltage data code represents the amplitude and ways for generating the voltage.

The controller is configured for sending control signals to the digital signal generation module in accordance with the voltage data code. Alternatively, when the output verification module sends an error feedback, the controller sends the control signals to the digital signal generation module in accordance with the copy of the code. Specifically, after being electrified, the controller reads the voltage data code from the NVM, and sends the control signals to the digital signal generation module in accordance with the data voltage code. Alternatively, when the output verification module sends the error feedback indicating abnormal Gamma voltage, the controller reads the copy of the code from the backup area of the NVM. In addition, the controller sends the control signals to the digital signal generation module in accordance with the copy of the code. In this way, when the output is abnormal, the copy of the code, which is saved in advance, may be utilized to correct the output.

The digital signal generation module is configured for outputting the digital signals to the DAC in accordance with the control signals. It can be understood that the digital signal generation module of FIG. 1 includes 14 output ports in parallel, each of the output ports connects to one DAC.

The DAC is configured for converting the digital signals to the Gamma voltage and outputs the Gamma voltage. Specifically, each of the DACs converts the received digital signals to Gamma voltage and outputs the Gamma voltage.

The output verification module is configured for verifying whether the Gamma voltage is within a predetermined voltage range, which may relate to a normal range of the Gamma voltage. If the Gamma voltage is within the predetermined voltage range, the output of the Gamma voltage is normal. If the Gamma voltage is not within the predetermined voltage range, the output of the Gamma voltage is abnormal.

Figure 2:
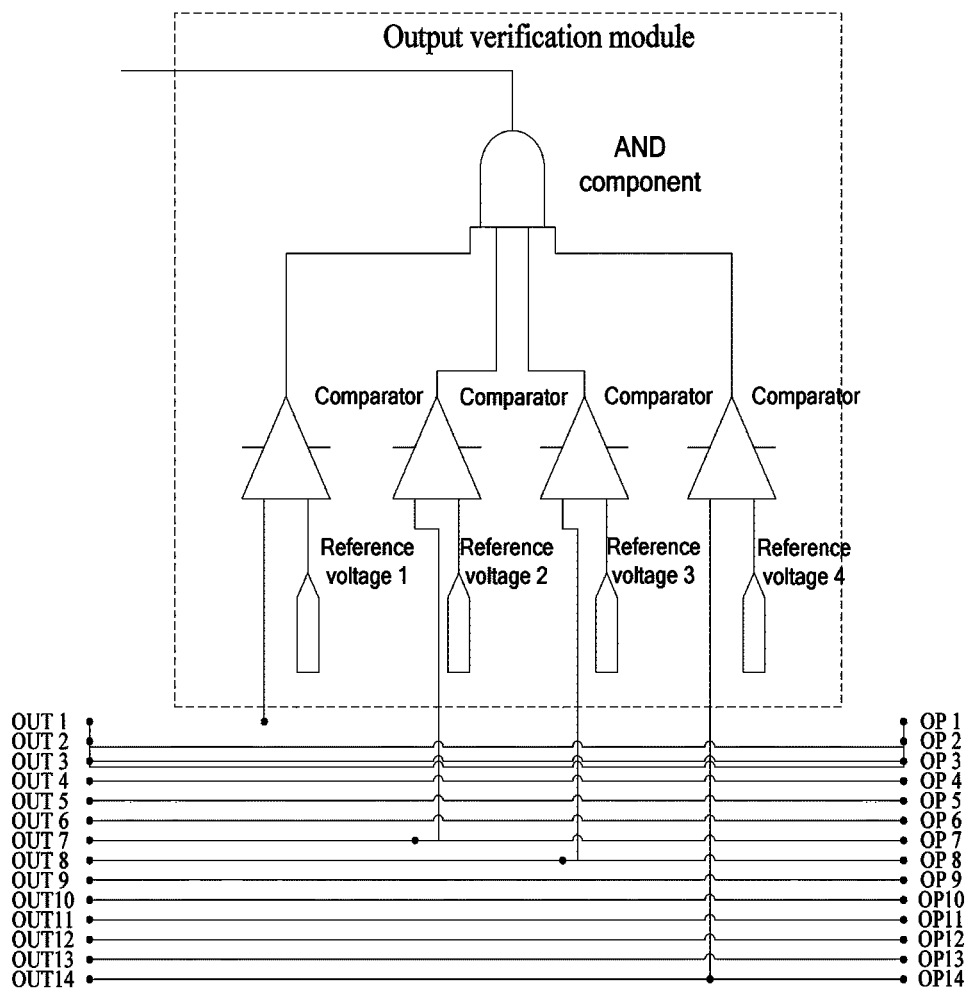
FIG. 2 is a schematic view of the output verification module in accordance with one embodiment.

Specifically, the output verification module of FIG. 2 includes a plurality of comparators and an AND component. As shown, OUT1-OUT14 relate to the 14 outputs of the DAC. The non-inverting input ends of each of the comparators respectively connect to the output ends of different DACs. The inverting input ends of each of the comparators respectively connect to a predetermined reference voltage. The output ends of each of the comparators respectively connect to different input ends of the AND component, and an output end of the AND component connect to the controller.

Figure 4:
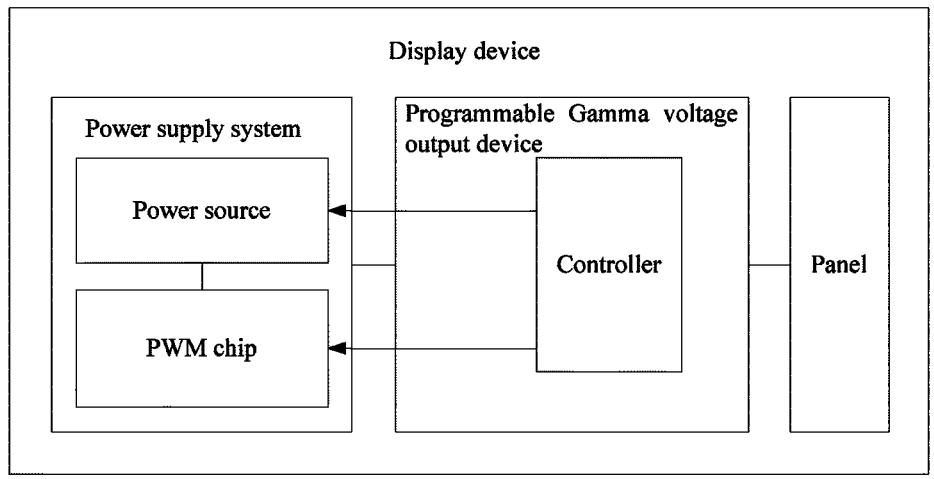
FIG. 4 is a schematic view of the display device in accordance with one embodiment.

It is to be noted that the number of the comparators is not limited, which may be smaller than or equal to the number of the DACs. For instance, as shown in FIG. 4, the number of the comparators may be four, and the non-inverting ends of the comparators may connect to the output ends of the first, the seventh, the eighth, and the ninth DAC. It can be understood that by configuring more comparators, the outputs of more circuits may be verified. The verification effect is good, but the cost may be higher. In addition, the reference voltages connected with the inverting ends of each of the comparators may be the same or different, and may be configured in accordance with real scenario. The key point of the present disclosure is to verify whether the outputs of the selected Gamma voltages are within the predetermined range so as to ensure whether the Gamma voltage outputted by the programmable Gamma voltage output device is normal.

Correspondingly, the principle of the output verification module is described hereinafter. When a difference between the Gamma voltage received from the non-inverting input end of the comparator and the reference voltage received from the inverting input end is not within the predetermined voltage range, a low level is outputted to the AND component. When any one of the input ends of the AND component receives the low level, the low level is outputted to the controller. When the difference between the Gamma voltage received from the non-inverting input end of the comparator and the reference voltage received from the inverting input end is within the predetermined voltage range, a high level is outputted to the AND component. When all of the input ends of the AND component receives the high level, the high level is outputted to the controller. It is to be noted that the predetermined voltage range is relative to the precision of the comparator. Generally, when the Gamma voltage received by the non-inverting input end of the comparators equals to or close to the reference voltage received by the inverting input end, the output end of the comparator outputs the high level. Otherwise, the low level is outputted.

Further, it is determined that at least one circuit outputs abnormal Gamma voltage when the controller receives the low level outputted from the AND component. The controller sends the control signals in accordance with the copy of the code. It is determined that normal Gamma voltage is outputted when the controller receives the high level outputted from the AND component. The controller sends the control signals in accordance with the voltage data code.

Further, when the controller sends the control signals in accordance with the copy of the code, if the error feedback is sent by the output verification module again, the controller stops sending the control signals, and the power supply system of the programmable Gamma voltage output device is turned off. It is because that the Gamma voltage outputted according to the voltage data code and the copy of the code are abnormal. Thus, the controller stops sending the control signals, and the power supply system of the programmable Gamma voltage output device is turned off. It is to be noted that the power supply system includes a power source and a PWM chip.

Figure 3:
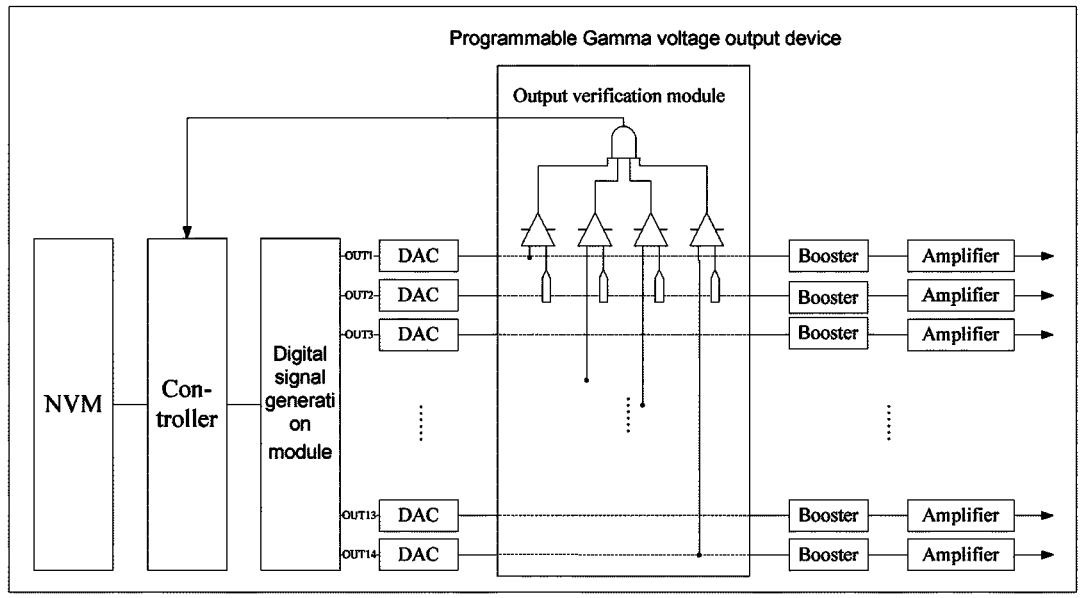
FIG. 3 is a schematic view of the programmable Gamma voltage output device in accordance with another embodiment.

FIG. 3 is a schematic view of the programmable Gamma voltage output device in accordance with another embodiment. FIG. 3 further describes the details of FIG. 2. As shown, the programmable Gamma voltage output device further includes a booster buffer and an operational amplifier. An input end of the booster buffer connects with the output end of the DAC. The input end of operational amplifier connects with the output end of the booster buffer. The output end of the operational amplifier may be the output end of the programmable Gamma voltage output device, wherein the booster buffer may increase the gain of the Gamma voltage outputted by the DAC, and the operational amplifier may amplify the boosted voltage so as to enhance the driving.

FIG. 4 is a schematic view of the display device in accordance with one embodiment. The display device includes a display panel, a power supply system, and the above programmable Gamma voltage output device. The power supply system connects with the programmable Gamma voltage output device, and the programmable Gamma voltage output device connects with the display panel, wherein:

The power supply system provides the power to the programmable Gamma voltage output device, the programmable Gamma voltage output device outputs the Gamma voltage to the display panel, and the display panel realizes the display function by the Gamma voltage.

In view of the above, the programmable Gamma voltage output device includes the NVM, the controller, the digital signal generation module, the DAC, and the output verification module. The NVM is configured for duplicating a copy of the code when programming the voltage data code. The controller is configured for sending control signals to the digital signal generation module. The digital signal generation module is configured for outputting the digital signals in accordance with the control signals. The DAC is configured for converting the digital signals into the Gamma voltage and for outputting the Gamma voltage. The output verification module is configured for sending the error feedback to the controller when the Gamma voltage is not within a predetermined voltage range. Further, the controller sends the control signals in accordance with the copy of the code so as to solve the abnormal Gamma voltage issue and to enhance the display performance.

In the embodiment, the modules of the programmable Gamma voltage output device may be combined, divided, or removed.

In the present disclosure, the controller may be accomplished by connecting to an external integrated circuit, such as a central processing unit (CPU), or an Application Specific Integrated Circuit (ASIC).

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A programmable Gamma voltage output device, comprising:
   a non-volatile memory (NVM), a controller, a digital signal generation module, a digital to analog converter (DAC), and output verification module, the NVM connects with the controller, the controller connects with the digital signal generation module, the digital signal generation module connects with the DAC, the DAC connects with the output verification module, and the output verification module connects with the controller, wherein:
   the NVM is configured for duplicating a copy of a corresponding voltage data code when programming the voltage data code;
   the controller is configured for sending control signals to the digital signal generation module in accordance with the voltage data code, or is configured for sending the control signals to the digital signal generation module in accordance with the copy of the code when the output verification module sends an error feedback;
   the digital signal generation module is configured for outputting digital signals to the DAC in accordance with the control signals;
   the DAC is configured for converting the digital signals to a Gamma voltage; and
   the output verification module is configured for verifying whether the Gamma voltage is within a predetermined voltage range, and for sending the error feedback when the Gamma voltage is not within a predetermined voltage range;
   wherein the output verification module comprises a plurality of comparators and an AND component,
   non-inverting input ends of each of the comparators respectively connect to output ends of different DACs, inverting input ends of each of the comparators respectively connect to a predetermined reference voltage, output ends of each of the comparators respectively connect to different input ends of the AND component, and an output end of the AND component connect to the controller;
   when a difference between the Gamma voltage received from the non-inverting input end of the comparator and the reference voltage received from the inverting input end is not within the predetermined voltage range, a low level is outputted to the AND component, when any one of the input ends of the AND component receives the low level, the low level is outputted to the controller; and the controller sends the control signals in accordance with the copy of the code upon receiving the low level outputted by the AND component.

2. The programmable Gamma voltage output device as claimed in claim 1, wherein the NVM comprises a predetermined backup area for storing the copy of the code.

3. The programmable Gamma voltage output device as claimed in claim 1, wherein:
when the difference between the Gamma voltage received from the non-inverting input end of the comparator and the reference voltage received from the inverting input end is within the predetermined voltage range, a high level is outputted to the AND component, when all of the input ends of the AND component receives the high level, the high level is outputted to the controller; and
the controller sends the control signals in accordance with the copy of the code upon receiving the high level outputted by the AND component.

4. The programmable Gamma voltage output device as claimed in claim 1, wherein the number of the comparators is less than or equals to the number of the DACs.

5. The programmable Gamma voltage output device as claimed in claim 1, wherein the controller sends the control signals in accordance with the copy of the code, if the error feedback is sent by the output verification module again, the controller stops sending the control signals, and a power supply system of the programmable Gamma voltage output device is turned off.

6. The programmable Gamma voltage output device as claimed in claim 5, wherein the power supply system further comprises a power supply and a PWM chip.

7. The programmable Gamma voltage output device as claimed in claim 1, wherein the programmable Gamma voltage output device further comprises a booster buffer, and an input end of the booster buffer connects with output ends of the DAC.

8. The programmable Gamma voltage output device as claimed in claim 7, wherein the programmable Gamma voltage output device further comprises an operational amplifier, an input end of the operational amplifier connects with an output end of the booster buffer.

9. A display device, comprising:
a display panel, a power supply system, and the programmable Gamma voltage output device as claimed in claim 1, the power supply system connects with the programmable Gamma voltage output device, and the programmable Gamma voltage output device connects with the display panel.

* * * * *